(12) United States Patent
Dou et al.

(10) Patent No.: US 10,784,071 B2
(45) Date of Patent: Sep. 22, 2020

(54) ELECTRON EMITTER AND METHOD OF FABRICATING SAME

(71) Applicant: ASML Netherlands B.V., AH Veldhoven (NL)

(72) Inventors: Juying Dou, San Jose, CA (US); Zheng Fan, Beijing (CN); Tzu-Yi Kuo, Hsinchu (TW); Zhongwei Chen, San Jose, CA (US)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 16/324,518

(22) PCT Filed: Jul. 31, 2017

(86) PCT No.: PCT/EP2017/069270
§ 371 (c)(1),
(2) Date: Feb. 8, 2019

(87) PCT Pub. No.: WO2018/029018
PCT Pub. Date: Feb. 15, 2018

(65) Prior Publication Data
US 2019/0172674 A1 Jun. 6, 2019

Related U.S. Application Data

(60) Provisional application No. 62/531,793, filed on Jul. 12, 2017, provisional application No. 62/372,084, filed on Aug. 8, 2016.

(51) Int. Cl.
*H01J 37/073* (2006.01)
*H01J 9/04* (2006.01)
(Continued)

(52) U.S. Cl.
CPC .............. *H01J 37/073* (2013.01); *H01J 1/14* (2013.01); *H01J 1/304* (2013.01); *H01J 9/025* (2013.01);
(Continued)

(58) Field of Classification Search
CPC ........ H01J 37/073; H01J 9/042; H01J 37/065; H01J 2237/06316; H01J 37/26;
(Continued)

(56) References Cited

U.S. PATENT DOCUMENTS 4,468,586 A 8/1984 Hohn
4,528,474 A 7/1985 Kim
(Continued)

FOREIGN PATENT DOCUMENTS

EP 1 950 786 A2 7/2008
EP 2 068 339 A1 6/2009
(Continued)

OTHER PUBLICATIONS

Office Action and Search Report issued from the Intellectual Property Office of ROC Taiwan Patent Application No. 106126688, dated Aug. 31, 2018.
(Continued)

*Primary Examiner* — Tracie Y Green
(74) *Attorney, Agent, or Firm* — Finnegan, Henderson, Farabow, Garrett & Dunner LLP

(57) ABSTRACT

Electron emitters and methods of fabricating the electron emitters are disclosed. According to certain embodiments, an electron emitter includes a tip with a planar region having a diameter in a range of approximately (0.05-10) micrometers. The electron emitter tip is configured to release field emission electrons. The electron emitter further includes a work-function-lowering material coated on the tip.

13 Claims, 8 Drawing Sheets

(51) Int. Cl.
*H01J 37/065* (2006.01)
*H01J 1/304* (2006.01)
*H01J 1/14* (2006.01)
*H01J 9/02* (2006.01)
*H01J 37/26* (2006.01)

(52) U.S. Cl.
CPC ............ *H01J 9/042* (2013.01); *H01J 37/065* (2013.01); *H01J 37/26* (2013.01); *H01J 2201/196* (2013.01); *H01J 2201/30403* (2013.01); *H01J 2201/30426* (2013.01); *H01J 2201/30449* (2013.01); *H01J 2201/30484* (2013.01); *H01J 2201/30492* (2013.01); *H01J 2209/0223* (2013.01); *H01J 2237/06308* (2013.01); *H01J 2237/06316* (2013.01); *H01J 2237/06341* (2013.01)

(58) Field of Classification Search
CPC .. H01J 9/025; H01J 1/304; H01J 2237/06308; H01J 2237/06325; H01J 37/3178
See application file for complete search history.

(56) References Cited

U.S. PATENT DOCUMENTS

| | | | | |
|---|---|---|---|---|
| 4,721,878 A * | 1/1988 | Hagiwara | ............ | H01J 27/022 313/336 |
| 7,176,610 B2 * | 2/2007 | Katsap | .................. | H01J 1/148 313/309 |
| 2008/0305598 A1 | 12/2008 | Horsky et al. | | |
| 2008/0315089 A1 * | 12/2008 | Yasuda | .................. | H01J 37/073 250/306 |
| 2010/0019648 A1 * | 1/2010 | Yasuda | .................. | B82Y 10/00 313/412 |

FOREIGN PATENT DOCUMENTS

| | | |
|---|---|---|
| EP | 2 197 015 A1 | 6/2010 |
| EP | 2 242 084 A1 | 10/2010 |
| EP | 2 787 522 A1 | 10/2014 |
| JP | S 57196445 | 12/1982 |
| JP | 2008181876 | 8/2008 |
| JP | 2015518245 | 6/2015 |
| TW | 548684 | 8/2003 |
| TW | 200715334 | 4/2007 |
| TW | 201230126 A1 | 12/2008 |
| TW | 201412448 A | 4/2014 |

OTHER PUBLICATIONS

International Search Report dated Nov. 2, 2017, in corresponding PCT International Application.
Notice of Reasons for Rejection from the Japanese Patent Office issued in related Patent Application No. 2019-506099; dated Jan. 29, 2020 (6 pages) (English-Language Translation).

* cited by examiner

ELECTRON EMITTER AND METHOD OF FABRICATING SAME

CROSS-REFERENCE TO RELATED APPLICATIONS

This application is a national stage filing under 35 U.S.C. § 371 of International Application No. PCT/EP2017/069270, filed on Jul. 31, 2017 and published as WO 2018/029018 A1, which claims priority of U.S. application 62/372,084 which was filed on Aug. 8, 2016 and U.S. application 62/531,793 which was filed on Jul. 12, 2017. The contents of these applications are each incorporated herein by reference in their entirety.

TECHNICAL FIELD

The present disclosure generally relates to the field of charged-particle sources, and more particularly, to electron emitters used in electron-beam apparatuses and methods of fabricating the electron emitters.

BACKGROUND

In manufacturing processes of integrated circuits (ICs), unfinished or finished circuit components are inspected to ensure that they are manufactured according to design and are free of defects. An inspection system utilizing an optical microscope typically has resolution down to a few hundred nanometers; and the resolution is limited by the wavelength of light. As the physical sizes of IC components continue to reduce down to a sub-100 or even sub-10 nanometers, inspection systems capable of higher resolution than those utilizing optical microscopes are needed.

A charged particle (e.g., electron) beam microscope, such as a scanning electron microscope (SEM) or a transmission electron microscope (TEM), capable of resolution down to less than a nanometer, serves as a practicable tool for inspecting IC components having a feature size that is sub-100 nanometers. With a SEM, electrons of a single primary electron beam, or electrons of a plurality of primary electron beams, can be focused at predetermined scan locations of a wafer under inspection. The primary electrons interact with the wafer and may be backscattered or may cause the wafer to emit secondary electrons. The intensity of the electron beams comprising the backscattered electrons and the secondary electrons may vary based on the properties of the internal and/or external structures of the wafer, and thus indicates whether the wafer has defects.

However, due to their high resolution, typical electron-beam inspection tools have low throughput. This limits the electron-beam inspection tools from being applied to wafer inspection in large scale. One way to improve the throughput is to increase the beam current of the primary electron beam, such that it can scan a larger area on the wafer, or it can be split into multiple beamlets for scanning multiple separate areas simultaneously. Current electron emitters, such as Schottky emitters, although capable of generating bright illumination, only have a small emission area from which electrons can be emitted. This limits the maximum beam current achievable at a given brightness. Moreover, the emission area may easily get deformed during high-brightness operation (i.e., high temperature and/or high electric field), which causes instabilities to the emitted electron beam(s) or reduces the emission area. Thus, current electron emitters cannot meet the high-throughput requirement.

SUMMARY

Embodiments of the present disclosure relate to electron emitters and methods of fabricating the electron emitters. In some embodiments, an electron emitter is provided. The electron emitter includes a tip with a planar region having a diameter in a range of approximately (0.05-10) micrometers. The electron emitter further includes a work-function-lowering material coated on the tip.

In some embodiments, a thermal field emission cathode is provided. The thermal field emission cathode includes an emitter, which further includes a tip configured to release field emission electrons, the tip having a planar region with a diameter in a range of approximately (0.05-10) micrometers. The thermal field emission cathode also includes a work-function-lowing material coated on the tip. The thermal field emission cathode further includes a heating component configured to provide thermal energy to the emitter.

In some embodiments, a method of fabricating an electron emitter is provided. The method includes applying a restraint to an electron emitter having a tip. The method also includes, under the restraint, forming a planar region on the tip. The method further includes removing the restraint.

In some embodiments, a method of fabricating an electron emitter is provided. The method includes coating a work-function-lowering material on a tip of an electron emitter having a base material. The work-function-lowering material includes at least one of: an oxide compound of zirconium, hafnium, titanium, scandium, yttrium, vanadium, lanthanum, praseodymium, neodymium, samarium, europium, gadolinium, terbium, dysprosium, holmium, erbium, ytterbium, lutetium, or thorium; a nitride compound of zirconium, titanium, niobium, scandium, vanadium, or lanthanum; and an oxynitride compound of zirconium, hafnium, titanium, scandium, yttrium, vanadium, lanthanum, praseodymium, neodymium, samarium, europium, gadolinium, terbium, dysprosium, holmium, erbium, ytterbium, lutetium, niobium, or thorium.

Additional objects and advantages of the disclosed embodiments will be set forth in part in the following description, and in part will be apparent from the description, or may be learned by practice of the embodiments. The objects and advantages of the disclosed embodiments may be realized and attained by the elements and combinations set forth in the claims.

It is to be understood that both the foregoing general description and the following detailed description are exemplary and explanatory only and are not restrictive of the disclosed embodiments, as claimed.

DESCRIPTION OF THE EMBODIMENTS

Reference will now be made in detail to exemplary embodiments, examples of which are illustrated in the accompanying drawings. The following description refers to the accompanying drawings in which the same numbers in different drawings represent the same or similar elements unless otherwise represented. The implementations set forth in the following description of exemplary embodiments do not represent all implementations consistent with the invention. Instead, they are merely examples of apparatuses and methods consistent with aspects related to the invention as recited in the appended claims.

Figure 1:
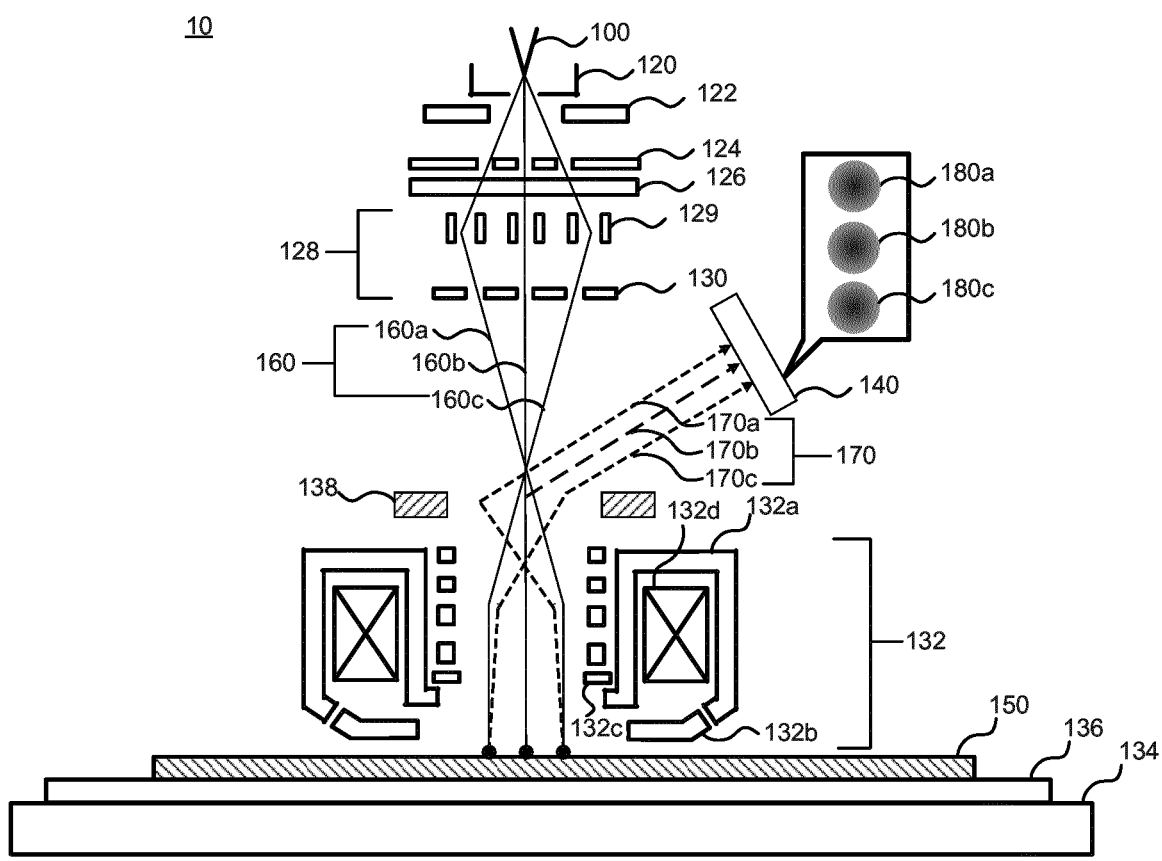
FIG. 1 is a schematic diagram illustrating an exemplary electron beam tool, consistent with embodiments of the present disclosure.

The present application discloses electron emitters that can generate electron beams with high brightness and beam current, as well as methods for preparing or fabricating the electron emitters. The disclosed electron emitters may be used in many technologies, such as in manufacturing processes of integrated circuits (ICs). FIG. 1 is a schematic diagram illustrating an exemplary electron beam tool 10, consistent with embodiments of the present disclosure. As shown in FIG. 1, electron beam tool 10 includes a motorized stage 134 and a wafer holder 136 supported by motorized stage 134 to hold a wafer 150 to be inspected. Electron beam tool 10 further includes a cathode 100, an anode 120, a gun aperture 122, a beam limit aperture 124, a condenser lens 126, a source conversion unit 128, an objective lens assembly 132, a beam separator 138, and an electron detector 140. Source conversion unit 128, in some embodiments, can include a micro-deflectors array 129 and a beamlet-limit plate 130. Objective lens assembly 132, in one embodiment, can include a modified swing objective retarding immersion lens (SORIL), which includes a pole piece 132a, a control electrode 132b, a deflector 132c, and an exciting coil 132d. Electron beam tool 10 may additionally include an energy dispersive X-ray spectrometer (EDS) detector (not shown) to characterize the materials on the wafer.

When electron beam tool 10 operates, a wafer 150 to be inspected is mounted or placed on wafer holder 136, which is supported by motorized stage 134. A voltage is applied between anode 120 and cathode 100, cathode 100 emits an electron beam 160. The emitted electron beam passes through gun aperture 122 and beam limit aperture 124, both of which can determine the size of electron beam entering condenser lens 126, which resides below beam limit aperture 124. Condenser lens 126 can focus the emitted electron beam 160 before electron beam 160 enters source conversion unit 128. Micro-deflectors array 129 can split the emitted beam into multiple primary electron beams 160a, 160b, and 160c. The number of multiple primary beams is not limited to three and micro-deflector array 129 can be configured to split the emitted beam into greater number of primary electron beams. Beamlet-limit plate 130 can set the size of the multiple primary electron beams before entering objective lens assembly 132. Deflector 132c deflects the primary electron beams 160a, 160b, and 160c to facilitate beam scanning on the wafer. For example, in a scanning process, deflector 132c can be controlled to deflect primary electron beams 160a, 160b, and 160c simultaneously onto different locations of top surface of wafer 150 at different time points, to provide data for image reconstruction for different parts of wafer 150.

Exciting coil 132d and pole piece 132a generate a magnetic field that begins at one end of pole piece 132a and terminates at the other end of pole piece 132a. A part of wafer 150 being scanned by primary electron beam 160 can be immersed in the magnetic field and can be electrically charged, which, in turn, creates an electric field. The electric field reduces the energy of impinging primary electron beam 160 near the surface of the wafer before it collides with the wafer. Control electrode 132b, being electrically isolated from pole piece 132a, controls an electric field on the wafer to prevent micro-arching of the wafer and to ensure proper beam focus.

Backscattered primary electrons and secondary electrons can be emitted from the part of wafer 150 upon receiving primary electron beams 160a, 160b, and 160c. Beam separator 138 can direct the secondary and/or scattered electron beams 170a, 170b, and 170c, comprising backscattered and secondary electrons, to sensor surface of electron detector 140. The detected electron beams 170a, 170b, and 170c can form corresponding beam spots 180a, 180b, and 180c on the sensor surface of electron detector 140. Electron detector 140 can generate signals (e.g., voltages, currents, etc.) that represent the intensities of the received beam spots, and provide the signals to a processing system (not shown in FIG. 1). The intensity of secondary and/or scattered electron beams 170a, 170b, and 170c, and the resultant beam spots, can vary according to the external and/or internal structure of wafer 150. Moreover, as discussed above, primary electron beams 160a, 160b, and 160c can be projected onto different locations of the top surface of wafer 150 to generate secondary and/or scattered electron beams 170a, 170b, and 170c (and the resultant beam spots) of different intensities. Therefore, by mapping the intensities of the beam spots with the locations of wafer 150, the processing system can reconstruct an image that reflects the internal and/or external structures of wafer 150.

Although FIG. 1 shows electron beam tool 10 as a multi-beam inspection tool that employs multiple primary electron beamlets to simultaneously scan multiple locations on wafer 150, it is contemplated that electron beam tool 10 may also be a single-beam inspection tool that uses only one primary electron beam to scan one location of wafer 150 at a time. Moreover, electron beam tool 10 may also be implemented as an electron-beam lithography (EBL) system, such as an electron-beam direct write (EBDW) system. The present application does not limit the specific system or technology area where the disclosed electron emitter is applied.

Figure 2:
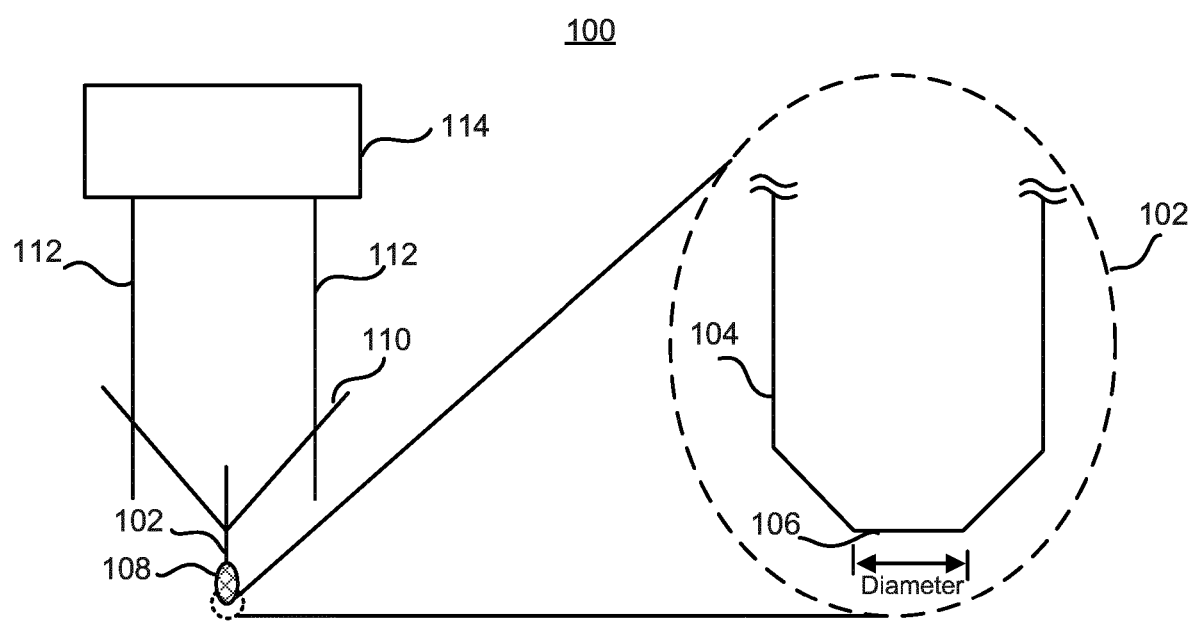
FIG. 2 is a schematic diagram illustrating an exemplary thermal field emission cathode used in the exemplary electron beam tool of FIG. 1.

Whether electron beam tool 10 is used to inspect a wafer or perform electron-beam lithography, the disclosed electron emitters can emit larger beam current, so as to improve the throughput of electron beam tool 10. FIG. 2 is a schematic diagram illustrating a cathode 100 used in the exemplary electron beam tool of FIG. 1. In exemplary embodiments, cathode 100 may be a thermal field emission cathode, e.g., a Schottky cathode, which uses a combination of heat and electric field to emit electrons. Referring to FIG. 2, cathode 100 includes an electron emitter 102, a filament 110, two electrodes 112, and a base 114.

Base 114 is made of an electrically insulating material, such as ceramic or thermal ceramic. In some embodiments, the electrically insulating material may be zirconium dioxide (ZrO$_2$), aluminum oxide (Al$_2$O$_3$), aluminum nitride (AlN), etc. Base 114 supports the two electrodes 112. Each electrode 112 has one end embedded in base 114. Electrodes 112 are made of electrically conductive material, such as nickel ferrous alloy.

Filament 110 is an electrically conductive wire, made of, for example, tungsten or rhenium. The two ends of filament 110 are welded to two electrodes 112, respectively. Filament 110 may also be bended at a central portion. The bended angle of filament 110 may range from 10 to 100 degree. Electron emitter 102 is mounted on the central portion of filament 110, such that filament 110 is convex to electron emitter 102 at the central portion.

Electron emitter 102 includes an emitter tip 104, which has an apex 106. Apex 106 may be a planar region. The emitted electrons are in a narrow energy band and are emitted from apex 106 into a cone of emission. Normally, to escape from electron emitter 102, an electron must gain sufficient energy to overcome an energy barrier posed by the atoms and/or molecules present at the surface of apex 106. The amount of energy required to overcome the energy barrier is known as work function of electron emitter 102. In exemplary embodiments, emitter tip 104 and particularly spec 106 may be coated with a thin layer of coating material 108 to lower the work function. In the present disclosure, the material constituting the body of electron emitter 102 is referred to as "base material," and the coating material 108 is referred to as "work-function lowering material."

When cathode 100 is implemented as a Schottky cathode, electric current is supplied to filament 110 through electrodes 112. Filament 110 heats electron emitter 102 and thermally excites the electrons in electron emitter 102 such that they can escape over the work-function barrier. Additionally or alternatively, cathode 100 and anode 120 may generate a strong electric field at emitter tip 112, which facilitates the emission of electrons by tunneling through the work-function barrier. By adjusting the emitter temperature and/or strength of the electric field, cathode 100 may change the beam current emitted from electron emitter 102.

Schottky cathodes are capable of generating bright electron beams. Emitters used in typical Schottky cathodes, i.e., typical Schottky emitters, are made from a single crystal of tungsten oriented in the <100>, <110>, <111>, or <310> orientation. The Schottky emitters may also be made from other base material, such as molybdenum, iridium, or rhenium. The Schottky emitters may also be coated with work-function-lowering material, including, for example, compounds such as oxide, nitride, and carbon compound of zirconium, titanium, hafnium, yttrium, niobium, vanadium, thorium, scandium, beryllium, or lanthanum. For example, by making a Schottky emitter's apex surface to be the (100) crystal plane of tungsten and using zirconium oxide (ZrO) as the work-function-lowering material, the work function of the Schottky emitter may be lowered from 4.5 eV to 2.8 eV. The reduction of work function makes the Schottky emitter a brighter electron source. The working temperature of such ZrO coated tungsten emitter, i.e., the temperature at the emitter's apex, is in the range of (300-1,800)K.

Figure 3A:
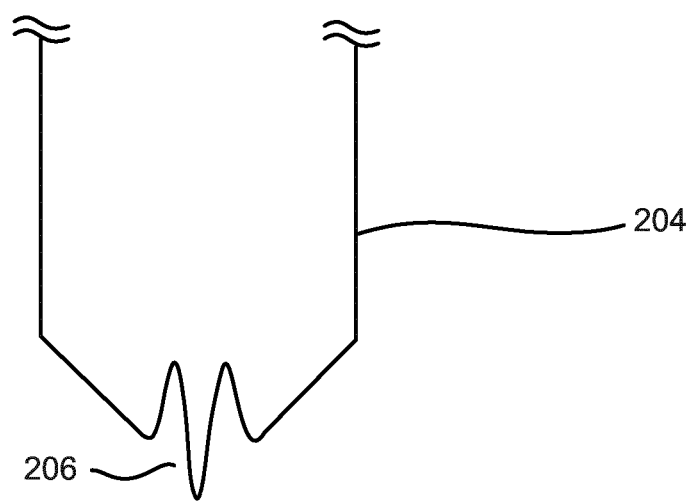
FIG. 3A is a schematic diagram illustrating a conventional tungsten emitter tip without coating material.

Although a tungsten Schottky emitter is capable of generating bright electron beams, the electric field and temperature applied on the emitter may cause surface self-diffusion at the emitter's apex. Specifically, at the high working temperature of the Schottky emitter, the base material and coating material tends to evaporate from the emitter's apex, which changes the original planar surface of the apex to a curved surface. Meanwhile, the high electric field causes the base material and coating material at the apex to migrate and therefore the surface of the apex to shrink, e.g., sharpening the emitter's tip. As such, the combined effect of high temperature and high electric field tends to cause the apex to have an irregular surface. FIG. 3A is a schematic diagram illustrating a tip 204 of a conventional tungsten emitter without coating material. As shown in FIG. 3A, tip 204 includes an apex 206, which originally has a planar surface (not shown). However, as the tungsten emitter keeps operating under high temperature and high electric field, the surface of apex 206 gradually gets deformed, which causes instabilities to the electron emission and lowers the beam current.

Referring back to FIG. 2, in the disclosed embodiments, to reduce the surface deformation, the base material of electron emitter 102 may be chosen from transition-metal-carbide compounds and/or transition-metal-boride compounds. For example, the transition-metal-carbide compound may be a carbide compound of hafnium, zirconium, tantalum, titanium, tungsten, molybdenum, or niobium. Also for example, the transition-metal-boride compound may be a boride compound of hafnium, zirconium, tantalum, titanium, tungsten, molybdenum, niobium, or lanthanum.

Compared to tungsten, transition metal carbides or transition metal borides have higher melting points, higher hardness, and lower work functions. For example, hafnium carbide has a melting point of 4,163K and has work functions in the (3.3-3.6) eV range. These properties of transition metal carbides and transition metal borides make them less susceptible to surface deformation under high temperature and/or high electric field.

In some embodiments, work-function-lowering material may be coated on transition metal carbides and transition metal borides, to further lower their work functions. The work-function-lowering material may include at least one of an oxide compound of zirconium, hafnium, titanium, scandium, yttrium, vanadium, lanthanum, praseodymium, neodymium, samarium, europium, gadolinium, terbium, dysprosium, holmium, erbium, ytterbium, lutetium, or thorium.

Alternatively or additionally, the work-function-lowering material may include at least one of a nitride compound of zirconium, titanium, niobium, scandium, vanadium, or lanthanum.

Alternatively or additionally, the work-function-lowering material may include at least one of an oxynitride compound of zirconium, hafnium, titanium, scandium, yttrium, vanadium, lanthanum, praseodymium, neodymium, samarium, europium, gadolinium, terbium, dysprosium, holmium, erbium, ytterbium, lutetium, niobium, or thorium.

Figure 3B:
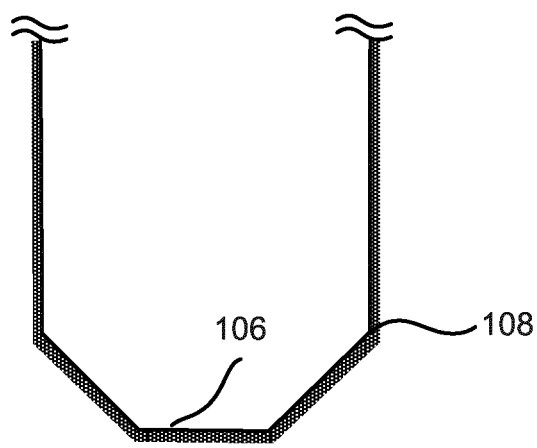
FIG. 3B is a schematic diagram illustrating an emitter tip coated with work-function-lowering material, consistent with embodiments of the present disclosure.

FIG. 3B is a schematic diagram illustrating an emitter tip 104 coated with work-function-lowering material 108, consistent with embodiments of the present disclosure. The base material of emitter tip 104 includes transition metal carbides and/or transition metal borides. Work-function-lowering material 108 includes the above-disclosed work-function-lowering material and may lower the work functions of transition metal carbides and/or transition metal borides, for example, from approximately 3.3 eV to approximately 2.3 eV. With the lowered work functions, the angular intensity of the electron beam emitted from apex 106, defined as the electron current (i.e., beam current) divided by the solid angle through which the electrons are emitted, may reach the range of (15-400) mA/Sr. Moreover, the electric field required to be applied on emitter tip 104 to achieve a given brightness may be reduced. Such weaker electric field reduces the chance of surface deformation at apex 106. As shown by FIG. 3B, the planar surface of apex 106 may be maintained without deformation, for a prolonged time period.

In the disclosed embodiments, the emission area, i.e., the planar region at apex 106, of electron emitter 102 may also be enlarged, to increase the angular intensity of the electrons emitted from apex 106. Referring back to FIG. 2, in some embodiments, apex 106 may be configured to have a diameter in a range of approximately (0.05-10) micrometers. For example, the angular intensity of the electron beam emitted from a tungsten emitter with such apex diameter can reach the range of (1-25) mA/Sr.

Traditionally, it has been difficult to enlarge the size of the apex of a tungsten tip because of the relatively low mechanical strength of tungsten. As explained above, transition metal carbides or transition metal borides have higher hardness than tungsten. Thus, compared to tungsten emitters, it is easier to polish an emitter tip made from transition metal carbides or transition metal borides. Moreover, methods 500 and 700 described below may be used to enlarge the size of the apex of an emitter tip, whether the emitter tip is made from tungsten, transition metal carbides, transition metal borides, or other kinds of base material.

With increased angular intensity of the emitted electrons, disclosed electron emitter 102 may help improve the throughput of electron beam tool 10. For example, when electron beam tool 10 is a single-beam inspection tool, a primary electron beam with higher angular intensity can be used to scan a larger area on wafer 150 or to perform voltage-contrast (VC) defect inspection of high aspect ratio contacts (HARCs). As another example, when electron beam tool 10 is a multiple-beam inspection tool, the higher angular intensity makes it feasible to divide the primary electron beam into multiple beamlets, so that multiple locations on wafer 150 may be scanned simultaneously. Moreover, similar to the case of the single-beam inspection tool, the higher angular intensity makes it possible for the multi-beam inspection tool to perform voltage-contrast defect inspection. As yet another example, when electron beam tool 10 is an EBDW system, the higher angular intensity provides larger beam current, which improves the lithography efficiency.

Figure 4:
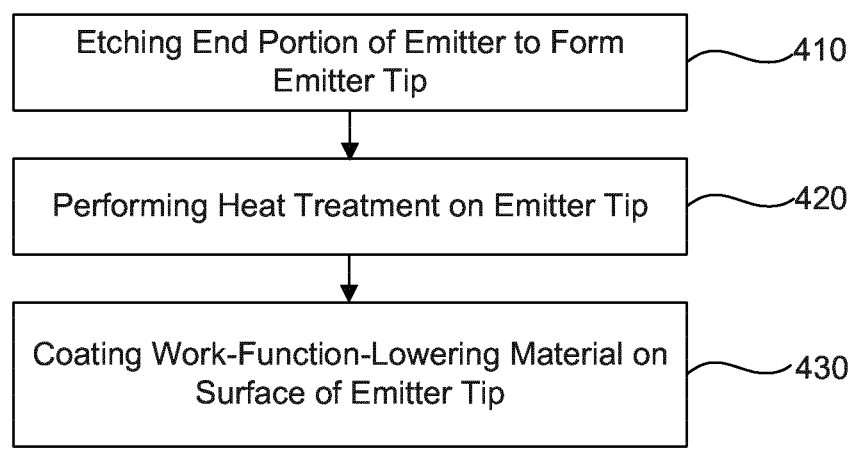
FIG. 4 is a flowchart of an exemplary method of preparing an electron emitter, consistent with embodiments of the present disclosure.

Next, exemplary methods of preparing or fabricating the disclosed electron emitters are disclosed. FIG. 4 is a flowchart of exemplary method 400 of preparing an electron emitter, according to some embodiments of the present disclosure. For example, the electron emitter may be electron emitter 102 shown in FIG. 2. The base material of the electron emitter may include at least one of a transition-metal-carbide compound or a transition-metal-boride compound. The transition-metal-carbide compound may be a carbide compound of hafnium, zirconium, tantalum, titanium, tungsten, molybdenum, or niobium. The transition-metal-boride compound may be a boride compound of hafnium, zirconium, tantalum, titanium, tungsten, molybdenum, niobium, or lanthanum. Method 400 may be performed to coat a work-function-lowering material (e.g., work-function-lowering material 108) on an emitter tip (e.g., emitter tip 104) of the electron emitter to lower the work function of the electron emitter.

Referring to FIG. 4, method 400 may include one or more of the following steps 410-430. In step 410, an end portion of an emitter wire or rod is etched to form the emitter tip of the electron emitter. The base material of the emitter wire/rod includes a transition-metal-carbide compound or a transition-metal-boride compound. In some embodiments, the emitter wire/rod may be etched electrochemically, using any etching method known in the art. In some embodiments, if the emitter tip has already been formed, such as if the electron emitter is a commercial available emitter who already has an emitter tip, step 410 may be skipped.

In step 420, heat treatment is performed on the electron emitter to desorb contaminants on the surface of the emitter tip. The electron emitter can be heated, for example, by driving a direct current through the electron emitter, bombarding the electron emitter with electrons, touching a hot filament directly to the electron emitter, or resistively heating the electron emitter by field emission. The present disclosure does not limit the method of performing the heat treatment.

In step 430, the emitter tip is coated with a layer of a work-function-lowering material (e.g., work-function-lowering material 108). In the disclosed embodiments, the work-function-lowering material may include at least one of an oxide compound of zirconium, hafnium, titanium, scandium, yttrium, vanadium, lanthanum, praseodymium, neodymium, samarium, europium, gadolinium, terbium, dysprosium, holmium, erbium, ytterbium, lutetium, or thorium.

Alternatively or additionally, the work-function-lowering material may include at least one of a nitride compound of zirconium, titanium, niobium, scandium, vanadium, or lanthanum.

Alternatively or additionally, the work-function-lowering material may include at least one of an oxynitride compound of zirconium, hafnium, titanium, scandium, yttrium, vanadium, lanthanum, praseodymium, neodymium, samarium, europium, gadolinium, terbium, dysprosium, holmium, erbium, ytterbium, lutetium, niobium, or thorium.

Figure 5:
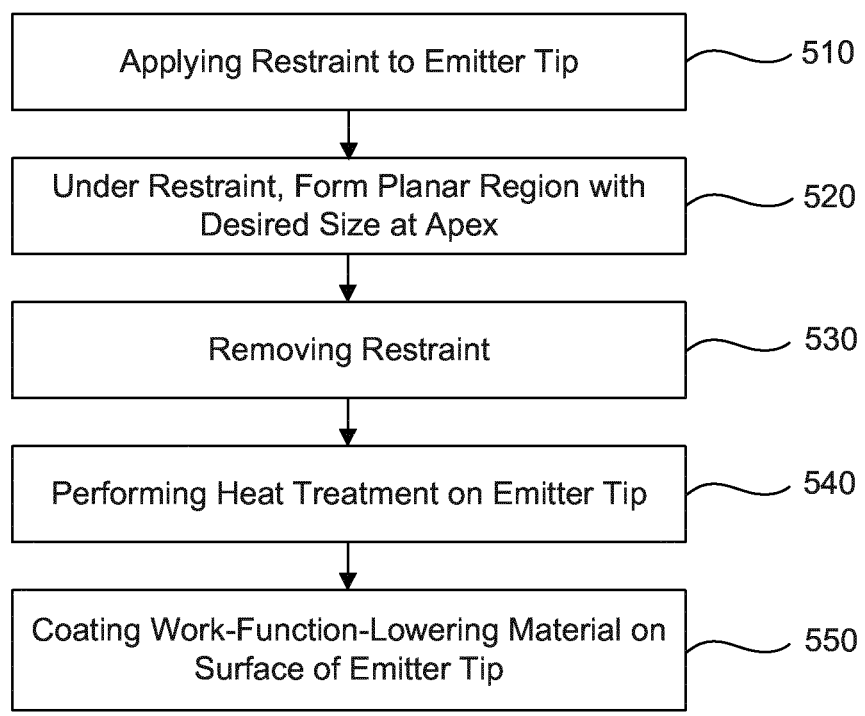
FIG. 5 is a flowchart of an exemplary method of preparing an electron emitter-consistent with embodiments of the present disclosure.

FIG. 5 is a flowchart of an exemplary method 500 of preparing an electron emitter, according to some embodiments of the present disclosure. For example, the electron emitter may be electron emitter 102 shown in FIG. 2. The electron emitter may already have an emitter tip (e.g., emitter tip 104) suitable for emitting electrons, and method 500 may be used to enlarge the size of an apex (e.g., apex 106) of the electron emitter. The base material of the electron emitter may include tungsten, molybdenum, iridium, rhenium, transition-metal-carbide compounds, transition-metal-boride compounds, or other kinds of base material.

Referring to FIG. 5, method 500 may include one or more of the following steps 510-550. In step 510, a restraint is applied to the emitter tip. The restraint is used to assist the emitter tip in withstanding mechanical strain when the emitter tip is under stress, to enhance the mechanical strength of the base material at the emitter tip, to relieve the stress directly applied by the apex enlargement process on the base material of the emitter tip, and/or to keep the emitter tip from moving. This way, the apex may be polished without breaking or damaging the emitter tip. In some embodiments, the restraint may be in the form of a fixture, a jig, or a clamp holding around, fastened to, attached to, mounted to, or glued to the emitter tip.

Figure 6:
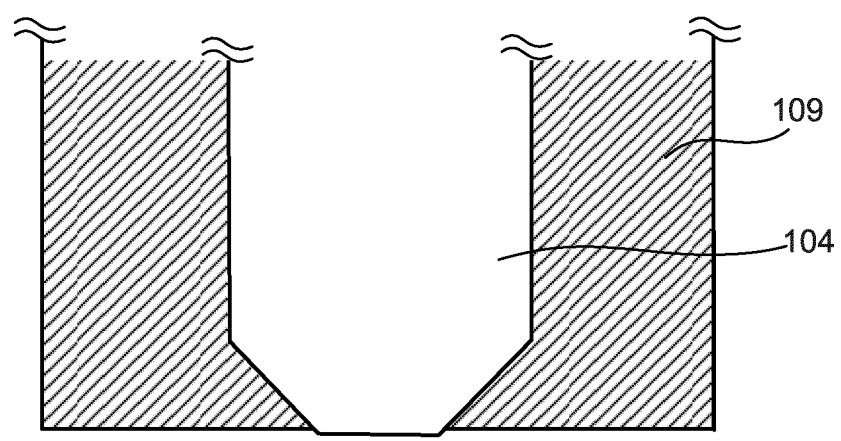
FIG. 6 is a schematic diagram illustrating a fixture or jig attached to an emitter tip of the thermal field emission cathode of FIG. 2, consistent with embodiments of the present disclosure.

FIG. 6 is a schematic diagram illustrating an exemplary fixture or jig 109 attached to emitter tip 104 of FIG. 2, according to some embodiments of the present disclosure. Referring to FIG. 6, fixture or jig 109 may be wax, e.g., thermal wax, applied on emitter tip 104. Wax 109 forms a layer around emitter tip 104. The wax layer has a thickness suitable for effectively relieving stress on the base material of emitter tip 104. If emitter tip 104 is pre-coated with work-function lowering material 108, wax 109 may be directly applied on top of work-function lowering material 108. Alternatively, work-function lowering material 108 may be first removed from emitter tip 104, and wax 109 is subsequently applied to the base material of emitter tip 104.

Referring back to FIG. 5, in step 520 of method 500, under the restraint, a planar region with a desirable size may be formed at the apex. Alternatively, if the apex already has a planar region before method 500 is performed, the planar region may be enlarged to reach the desirable size.

The planar region may be formed or enlarged using various methods. In some embodiments, the restraint may create enough force to form or enlarge the planar region at the apex. For example, a fixture/jig/clamp may be applied on the emitter tip to form the planar region directly. In another embodiment, the emitter tip under the restraint may be polished to form or enlarge the planar region. The polishing may be performed electrolytically or mechanically, using any polishing method known in the art.

Because the restraint (e.g., fixture, jig, clamp, wax, etc.) is applied to the emitter tip, the emitter tip is capable of sustaining larger strain or stress without being broken or deformed. As such, a planar region with a diameter in the range of, e.g., (0.05-10) micrometers, may be formed at the apex, without damaging the emitter tip.

In step 530, after the planar region with the desirable size is formed at the apex, the restraint is removed from the emitter tip. For example, if the restraint is in the form of wax, the wax may be melted with heat and washed with acetone.

In step 540, heat treatment is performed on the electron emitter to desorb contaminants on the surface of the emitter tip. This step is similar to step 420 of method 400.

In step 550, the emitter tip is coated with a layer of a work-function-lowering material (e.g., work-function-lowering material 108). The work-function-lowering material may be selected based on the type of the base material. For example, when the base material is tungsten, molybdenum, iridium, or rhenium, the work-function-lowering material may be oxide, nitride, and carbon compound of zirconium, titanium, hafnium, yttrium, niobium, vanadium, thorium, scandium, beryllium, or lanthanum.

As another example, when the base material is a transition-metal-carbide compound or a transition-metal-boride compound, the work-function-lowering material may include an oxide compound of zirconium, hafnium, titanium, scandium, yttrium, vanadium, lanthanum, praseodymium, neodymium, samarium, europium, gadolinium, terbium, dysprosium, holmium, erbium, ytterbium, lutetium, or thorium; a nitride compound of zirconium, titanium, niobium, scandium, vanadium, or lanthanum; and/or an oxynitride compound of zirconium, hafnium, titanium, scandium, yttrium, vanadium, lanthanum, praseodymium, neodymium, samarium, europium, gadolinium, terbium, dysprosium, holmium, erbium, ytterbium, lutetium, niobium, or thorium.

Figure 7:
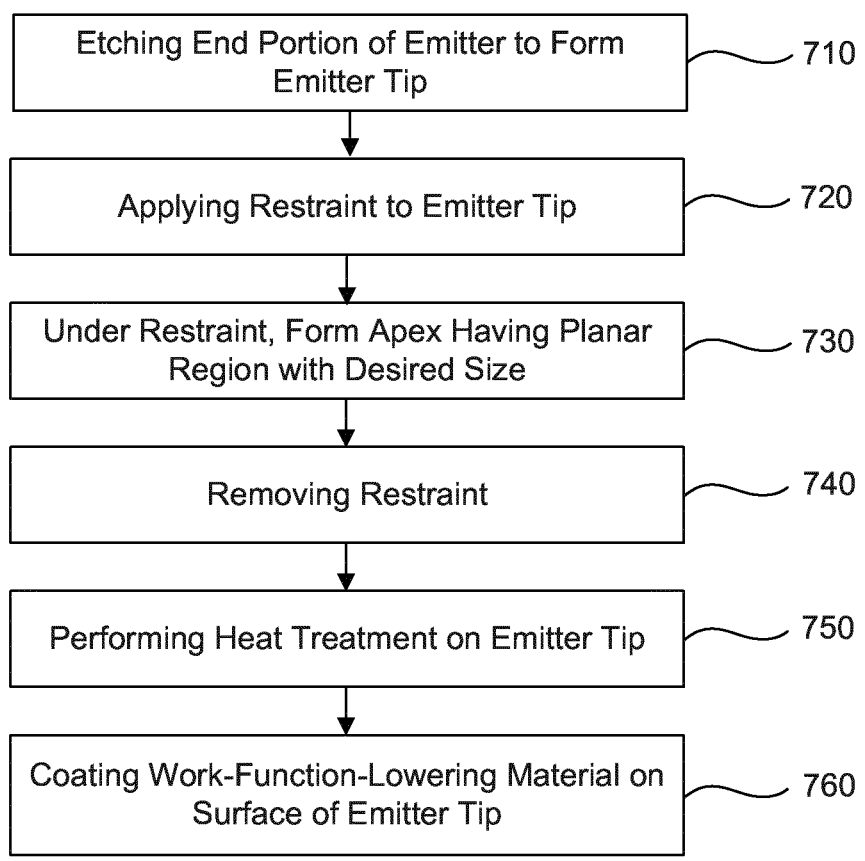
FIG. 7 is a flowchart of an exemplary method of preparing an electron emitter, consistent with embodiments of the present disclosure.

FIG. 7 is a flowchart of an exemplary method 700 of preparing an electron emitter, according to some embodiments of the present disclosure. For example, the electron emitter may be electron emitter 102 shown in FIG. 2. Unlike method 600, method 700 may be performed to prepare an electron emitter with a desirable apex size, from an emitter wire or rod without an emitter tip (e.g., emitter tip 104) suitable for emitting electrons. The emitter wire or rod is made of the base material constituting the electron emitter to be prepared. Referring to FIG. 7, method 700 may include one or more of the following steps 710-760.

In step 710, an end portion of an emitter wire or rod is etched to form an emitter tip of the electron emitter. Step 710 is similar to step 410 of method 400.

In step 720, a restraint is applied to the newly formed emitter tip. Step 720 is similar to step 510 of method 500.

In step 730, under the restraint, a planar region with a desirable size is form at the apex of the emitter tip. Step 730 is similar to step 520 of method 500.

In step 740, after the planar area with the desirable size is formed at the apex, the restraint is removed from the emitter tip. Step 740 is similar to step 530 of method 500.

In step 750, heat treatment is performed on the electron emitter to desorb contaminants on the surface of the emitter tip. This step is similar to step 420 of method 400 and step 540 of method 500.

In step 760, the emitter tip is coated with a layer of a work-function-lowering material (e.g., work-function-lowering material 108). This step is similar to step 550 of method 500.

The embodiments may further be described using the following clauses:

1. An electron emitter comprising:
   a tip with a planar region having a diameter in a range of approximately (0.05-10) micrometers; and
   a work-function-lowering material coated on the tip.
2. The electron emitter of clause 1, wherein the tip comprises single crystal tungsten.
3. The electron emitter of clause 2, wherein the single crystal tungsten has a crystal orientation of <100>.
4. The electron emitter of clause 1, wherein the tip comprises at least one of a transition-metal-carbide compound or a transition-metal-boride compound.
5. The electron emitter of clause 4, wherein the transition-metal-carbide compound is a carbide compound of hafnium, zirconium, tantalum, titanium, tungsten, molybdenum, or niobium.
6. The electron emitter of clause 4, wherein the transition-metal-boride compound is a boride compound of hafnium, zirconium, tantalum, titanium, tungsten, molybdenum, niobium, or lanthanum.
7. The electron emitter of any one of clauses 4-6, wherein the work-function-lowering material comprises:
   at least one of an oxide compound of zirconium, hafnium, titanium, scandium, yttrium, vanadium, lanthanum, praseodymium, neodymium, samarium, europium, gadolinium, terbium, dysprosium, holmium, erbium, ytterbium, lutetium, or thorium.
8. The electron emitter of any one of clauses 4-6, wherein the work-function-lowering material comprises:
   at least one of a nitride compound of zirconium, titanium, niobium, scandium, vanadium, or lanthanum.
9. The electron emitter of any one of clauses 4-6, wherein the work-function-lowering material comprises:
   at least one of an oxynitride compound of zirconium, hafnium, titanium, scandium, yttrium, vanadium, lanthanum, praseodymium, neodymium, samarium, europium, gadolinium, terbium, dysprosium, holmium, erbium, ytterbium, lutetium, niobium, or thorium.
10. A thermal field emission cathode, comprising:
    an emitter comprising:
    a tip configured to release field emission electrons, the tip having a planar region with a diameter in a range of approximately (0.05-10) micrometers; and
    a work-function-lowing material coated on the tip; and
    a heating component configured to provide thermal energy to the emitter.
11. The thermal field emission cathode of clause 10, wherein the tip comprises single crystal tungsten.

12. The thermal field emission cathode of clause 11, wherein the single crystal tungsten has a crystal orientation of <100>.
13. The thermal field emission cathode of clause 10, wherein the tip comprises at least one of a transition-metal-carbide compound or a transition-metal-boride compound.
14. The thermal field emission cathode of clause 13, wherein the transition-metal-carbide compound is a carbide compound of hafnium, zirconium, tantalum, titanium, tungsten, molybdenum, or niobium.
15. The thermal field emission cathode of clause 13, wherein the transition-metal-boride compound is a boride compound of hafnium, zirconium, tantalum, titanium, tungsten, molybdenum, niobium, or lanthanum.
16. The thermal field emission cathode of any one of clauses 13-15, wherein the work-function-lowering material comprises:
at least one of an oxide compound of zirconium, hafnium, titanium, scandium, yttrium, vanadium, lanthanum, praseodymium, neodymium, samarium, europium, gadolinium, terbium, dysprosium, holmium, erbium, ytterbium, lutetium, or thorium.
17. The thermal field emission cathode of any one of clauses 13-15, wherein the work-function-lowering material comprises:
at least one of a nitride compound of zirconium, titanium, niobium, scandium, vanadium, or lanthanum.
18. The thermal field emission cathode of any one of clauses 13-15, wherein the work-function-lowering material comprises:
at least one of an oxynitride compound of zirconium, hafnium, titanium, scandium, yttrium, vanadium, lanthanum, praseodymium, neodymium, samarium, europium, gadolinium, terbium, dysprosium, holmium, erbium, ytterbium, lutetium, niobium, or thorium.
19. The thermal field emission cathode of any one of clauses 10-18, wherein the heating means comprises a filament attached to the emitter.
20. The thermal field emission cathode of any one of clauses 10-19, further comprising:
a base;
two electrodes embedded into the base; and
an electrically conductive wire including two ends and a central portion, wherein the two ends of the electrically conductive wire are connected to the two electrodes respectively, and the emitter is mounted on the central portion of the electrically conductive wire, the electrically conductive wire being convex to the emitter at the central portion.
21. A method comprising:
applying a restraint to an electron emitter having a tip;
under the restraint, forming a planar region on the tip; and
removing the restraint.
22. The method of clause 21, wherein forming the planar region on the tip comprises:
polishing the tip of the electron emitter to form the planar region.
23. The method of any one of clauses 21 and 22, wherein applying the restraint to the electron emitter comprises:
attaching a fixture or a jig to the tip.
24. The method of clause 23, wherein forming the planar region on the tip comprises:
using the fixture or jig to form the planar region.
25. The method of any one of clauses 21-23, wherein applying the restraint to the electron emitter comprises:
applying wax on the tip.
26. The method of any one of clauses 21-25, further comprising:
after the restraint is removed, heating the electron emitter, wherein the heating removes contaminants on the tip.
27. The method of clause 26, further comprising:
after the heating, coating a work-function-lowering material on the tip.
28. The method of any one of clauses 21-27, wherein the electron emitter comprises single crystal tungsten.
29. The method of clause 28, wherein the single crystal tungsten has a crystal orientation of <100>.
30. The method of any one of clauses 21-27, wherein the electron emitter comprises at least one of a transition-metal-carbide compound or a transition-metal-boride compound.
31. The method of clause 30, wherein the transition-metal-carbide compound is a carbide compound of hafnium, zirconium, tantalum, titanium, tungsten, molybdenum, or niobium.
32. The method of clause 30, wherein the transition-metal-boride compound is a boride compound of hafnium, zirconium, tantalum, titanium, tungsten, molybdenum, niobium, or lanthanum.
33. The method of clause 30, further comprising:
after the restraint is removed, coating a work-function-lowering material on the tip, the work-function-lowering material comprising at least one of an oxide compound of zirconium, hafnium, titanium, scandium, yttrium, vanadium, lanthanum, praseodymium, neodymium, samarium, europium, gadolinium, terbium, dysprosium, holmium, erbium, ytterbium, lutetium, or thorium.
34. The method of clause 30, further comprising:
after the restraint is removed, coating a work-function-lowering material on the tip, the work-function-lowering material comprising at least one of a nitride compound of zirconium, titanium, niobium, scandium, vanadium, or lanthanum.
35. The method of clause 30, further comprising:
after the restraint is removed, coating a work-function-lowering material on the tip, the work-function-lowering material comprising at least one of an oxynitride compound of zirconium, hafnium, titanium, scandium, yttrium, vanadium, lanthanum, praseodymium, neodymium, samarium, europium, gadolinium, terbium, dysprosium, holmium, erbium, ytterbium, lutetium, niobium, or thorium.
36. The method of any one of clauses 21-35, further comprising:
etching an end portion of the electron emitter to form the tip.
37. The method of any one of clauses 21-36, wherein the planar region of tip has a diameter in a range of approximately (0.05-10) micrometers.
38. A method comprising:
coating a work-function-lowering material on a tip of an electron emitter having a base material, wherein the work-function-lowering material comprises at least one of:
an oxide compound of zirconium, hafnium, titanium, scandium, yttrium, vanadium, lanthanum, praseodymium, neodymium, samarium, europium, gadolinium, terbium, dysprosium, holmium, erbium, ytterbium, lutetium, or thorium;
a nitride compound of zirconium, titanium, niobium, scandium, vanadium, or lanthanum; and
an oxynitride compound of zirconium, hafnium, titanium, scandium, yttrium, vanadium, lanthanum, praseodymium, neodymium, samarium, europium, gadolinium, terbium, dysprosium, holmium, erbium, ytterbium, lutetium, niobium, or thorium.

39. The method of clause 38, wherein the base material of the electron emitter comprises at least one of a transition-metal-carbide compound or a transition-metal-boride compound.

40. The method of any one of clauses 38 and 39, wherein the transition-metal-carbide compound is a carbide compound of hafnium, zirconium, tantalum, titanium, tungsten, molybdenum, or niobium.

41. The method of any one of clauses 38 and 39, wherein the transition-metal-boride compound is a boride compound of hafnium, zirconium, tantalum, titanium, tungsten, molybdenum, niobium, or lanthanum.

42. The method of any one of clauses 38-41, further comprising:
before coating the work-function-lowering material on the tip, heating the electron emitter to remove contaminants on the tip.

43. The method of clause 42, further comprising:
before heating electron emitter to remove contaminants on the tip, etching an end portion of the electron emitter to generate the tip.

It will be appreciated that the present invention is not limited to the exact construction that has been described above and illustrated in the accompanying drawings, and that various modifications and changes can be made without departing from the scope thereof. It is intended that the scope of the invention should only be limited by the appended claims.

What is claimed is:

1. An electron emitter comprising:
a tip comprising single crystal tungsten and having a planar region with a diameter in a range of 1 micrometer to <10 micrometers; and
a work-function-lowering material coated on the tip.

2. The electron emitter of claim 1, wherein the work-function-lowering material comprises:
at least one of an oxide compound of zirconium, hafnium, titanium, scandium, yttrium, vanadium, lanthanum, praseodymium, neodymium, samarium, europium, gadolinium, terbium, dysprosium, holmium, erbium, ytterbium, lutetium, or thorium, or
at least one of a nitride compound of zirconium, titanium, niobium, scandium, vanadium, or lanthanum, or
at least one of an oxynitride compound of zirconium, hafnium, titanium, scandium, yttrium, vanadium, lanthanum, praseodymium, neodymium, samarium, europium, gadolinium, terbium, dysprosium, holmium, erbium, ytterbium, lutetium, niobium, or thorium.

3. A thermal field emission cathode, comprising: an emitter comprising:
a tip comprising single crystal tungsten and having a planar region with a diameter in a range of 1 micrometer to <10 micrometers, the tip configured to release field emission electrons;
a work-function-lowing material coated on the tip; and
a heating component configured to provide thermal energy to the emitter.

4. The thermal field emission cathode of claim 3, wherein the work-function-lowering material comprises:
at least one of an oxide compound of zirconium, hafnium, titanium, scandium, yttrium, vanadium, lanthanum, praseodymium, neodymium, samarium, europium, gadolinium, terbium, dysprosium, holmium, erbium, ytterbium, lutetium, or thorium, or
at least one of a nitride compound of zirconium, titanium, niobium, scandium, vanadium, or lanthanum, or
at least one of an oxynitride compound of zirconium, hafnium, titanium, scandium, yttrium, vanadium, lanthanum, praseodymium, neodymium, samarium, europium, gadolinium, terbium, dysprosium, holmium, erbium, ytterbium, lutetium, niobium, or thorium.

5. The thermal field emission cathode of claim 3, further comprising:
a base;
two electrodes embedded into the base; and
an electrically conductive wire including two ends and a central portion, wherein the two ends of the electrically conductive wire are connected to the two electrodes respectively, and the emitter is mounted on the central portion of the electrically conductive wire, the electrically conductive wire being convex to the emitter at the central portion.

6. A method comprising:
applying a restraint to an electron emitter having a tip, the tip comprising single crystal tungsten:
under the restraint, forming on the tip a planar region having a diameter in a range of 1 micrometer to <10 micrometers:
removing the restraint: and
after the restraint is removed, coating a work-function-lowering material on the tip.

7. The method of claim 6, wherein forming the planar region on the tip comprises:
polishing the tip of the electron emitter to form the planar region.

8. The method of claim 6 further comprising:
attaching a fixture or a jig to the tip; and
using the fixture or jig to form the planar region.

9. The method of claim 6, wherein applying the restraint to the electron emitter comprises:
applying wax on the tip.

10. The method of claim 6, further comprising:
after the restraint is removed and before the work-function-lowering material is coated on the tip, heating the electron emitter, wherein the heating removes contaminants on the tip.

11. The method of claim 6, wherein the work-function-lowering material comprises:
at least one of an oxide compound of zirconium, hafnium, titanium, scandium, yttrium, vanadium, lanthanum, praseodymium, neodymium, samarium, europium, gadolinium, terbium, dysprosium, holmium, erbium, ytterbium, lutetium, or thorium, or
at least one of a nitride compound of zirconium, titanium, niobium, scandium, vanadium, or lanthanum, or
at least one of an oxynitride compound of zirconium, hafnium, titanium, scandium, yttrium, vanadium, lanthanum, praseodymium, neodymium, samarium, europium, gadolinium, terbium, dysprosium, holmium, erbium, ytterbium, lutetium, niobium, or thorium.

12. The method of claim 6 further comprising:
  etching an end portion of the electron emitter to form the tip.
13. The electron emitter of claim 1, wherein the single crystal tungsten has a crystal orientation of <100>.

* * * * *